United States Patent
Kao

[11] Patent Number: 6,041,956
[45] Date of Patent: Mar. 28, 2000

[54] NETWORK DEVICE CASE

[76] Inventor: Ken Kao, 20, Park Ave. 2, Science-Based, Industrial Park, Hsin Chu, Taiwan

[21] Appl. No.: 09/188,254

[22] Filed: Nov. 10, 1998

[51] Int. Cl.[7] .................................................. A47B 75/00
[52] U.S. Cl. ........................................ 220/4.02; 220/4.21
[58] Field of Search ................................ 220/4.02, 4.21; 312/213, 223, 263, 328

[56] References Cited

U.S. PATENT DOCUMENTS

| | | | |
|---|---|---|---|
| 1,481,415 | 1/1924 | Casper | 220/4.21 |
| 3,950,603 | 4/1976 | Brefka | 220/4.21 |
| 4,089,464 | 5/1978 | Teti, Jr. et al. | 220/4.21 |
| 4,850,657 | 7/1989 | Plackz et al. | 220/4.21 |
| 4,884,710 | 12/1989 | Kleinz et al. | 220/4.02 |
| 5,303,823 | 4/1994 | Niles et al. | 220/4.21 |
| 5,398,833 | 3/1995 | Klauss et al. | 220/4.02 |
| 5,582,312 | 12/1996 | Niles et al. | 220/4.21 |

*Primary Examiner*—Joseph M. Moy
*Attorney, Agent, or Firm*—Bacon & Thomas

[57] ABSTRACT

A network device case includes a top cover shell having a horizontal top panel and a vertical rear panel, and a bottom cover shell having a horizontal bottom panel, a vertical front panel and two vertical lateral side panels, wherein the vertical rear panel is fixed to the horizontal bottom panel by screws and nuts and, the horizontal top panel and the vertical front panel are fastened together by a tongue-and-groove joint, the tongue-and-groove joint including a horizontal tongue integral the horizontal top panel, and a horizontal groove defined in a clamping plate fixedly connected to the vertical front panel.

3 Claims, 2 Drawing Sheets

NETWORK DEVICE CASE

BACKGROUND OF THE INVENTION

The present invention relates to a network device case for holding a network device, and more particularly to such a network device case that can be conveniently assembled to hold a network device on the inside.

In order to protect a network device and the related circuits against an impact, a metal case must be used to hold the network device and the related circuits on the inside. FIG. 1 shows a network device case for this purpose. This structure of network device case is comprised of a front panel 1, a top cover shell 2, and a bottom cover shell 3. The front panel 1 comprises a plurality of indicator light holes 4, and switch mounting holes 5. The number of the indicator light holes 4 as well as the number of the switch mounting holes 5 are determined subject to the type or model of the network device to be protected. This structure of network device case uses a big number of screws and nuts to fix the front panel 1, the top cover shell 2 and the bottom cover shell 3 together. During assembly, it takes much time to fasten up the screws. Further, because the indicator light holes 4 and the switch mounting holes 5 are designed subject to the type or model of the network device to be protected, the network device case can only be used with a particular type or model of a network device.

SUMMARY OF THE INVENTION

It is one object of the present invention to provide a network device case which can easily be assembled. It is another object of the present invention to provide a network device case which fits any of a variety of network devices. According to one aspect of the present invention, the network device case comprises a top cover shell having a horizontal top panel and a vertical rear panel, and a bottom cover shell having a horizontal bottom panel, a vertical front panel and two vertical lateral side panels, wherein the vertical rear panel is fixed to the horizontal bottom panel by screws and nuts and, the horizontal top panel and the vertical front panel are fastened together by a tongue-and-groove joint, the tongue-and-groove joint comprising a horizontal tongue integral the horizontal top panel, and a horizontal groove defined in a clamping plate fixedly connected to the vertical front panel. According to another aspect of the present invention, a replaceable metal plate is detachably mounted on the vertical front panel of the bottom cover shell to fit the design of the indicator lights of the network device to be protected.

DETAILED DESCRIPTION OF THE PREFERRED EMBODIMENT

Figure 1:
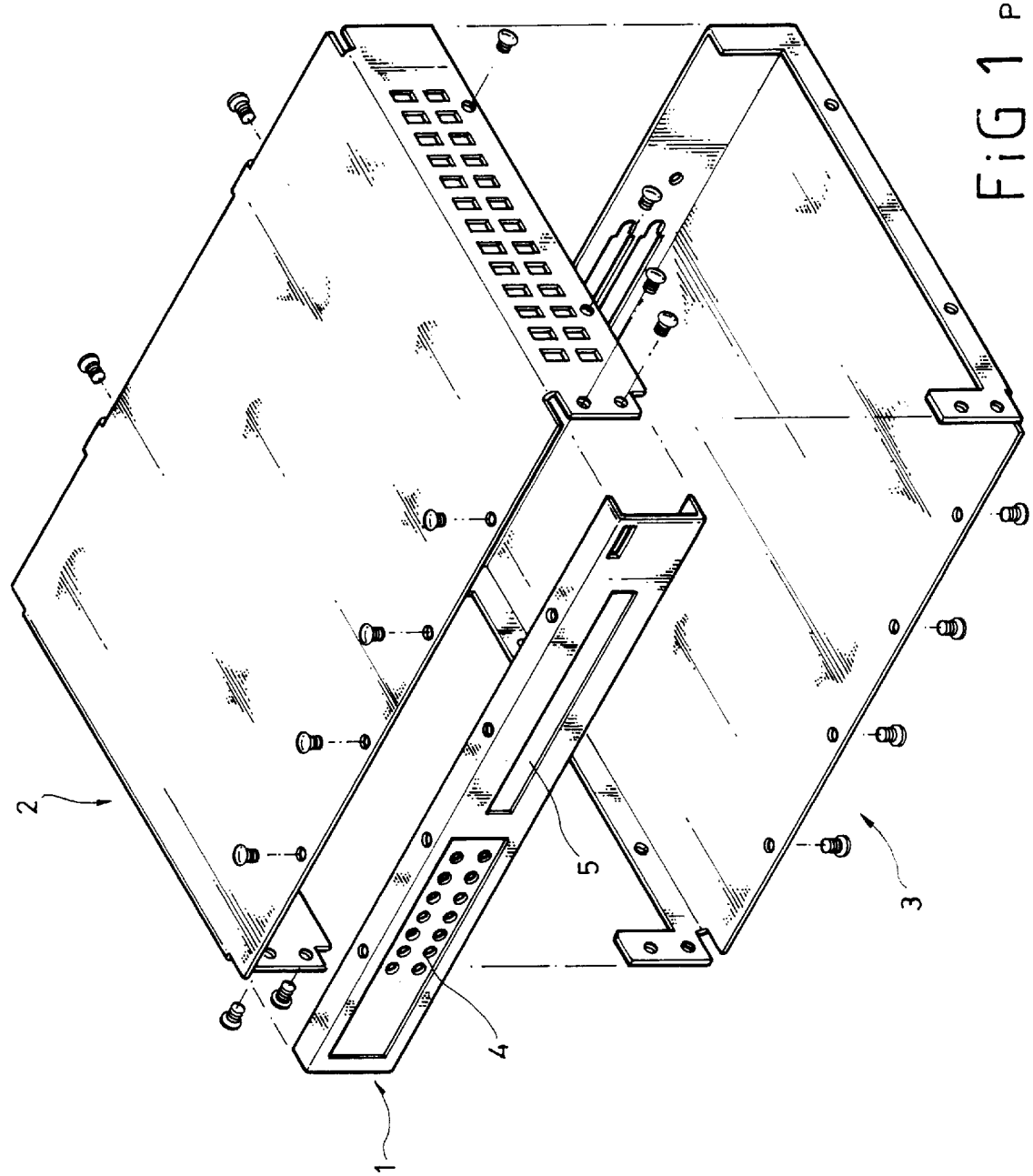
FIG. 1 is an exploded view of a network device case according to the prior art.
Figure 2:
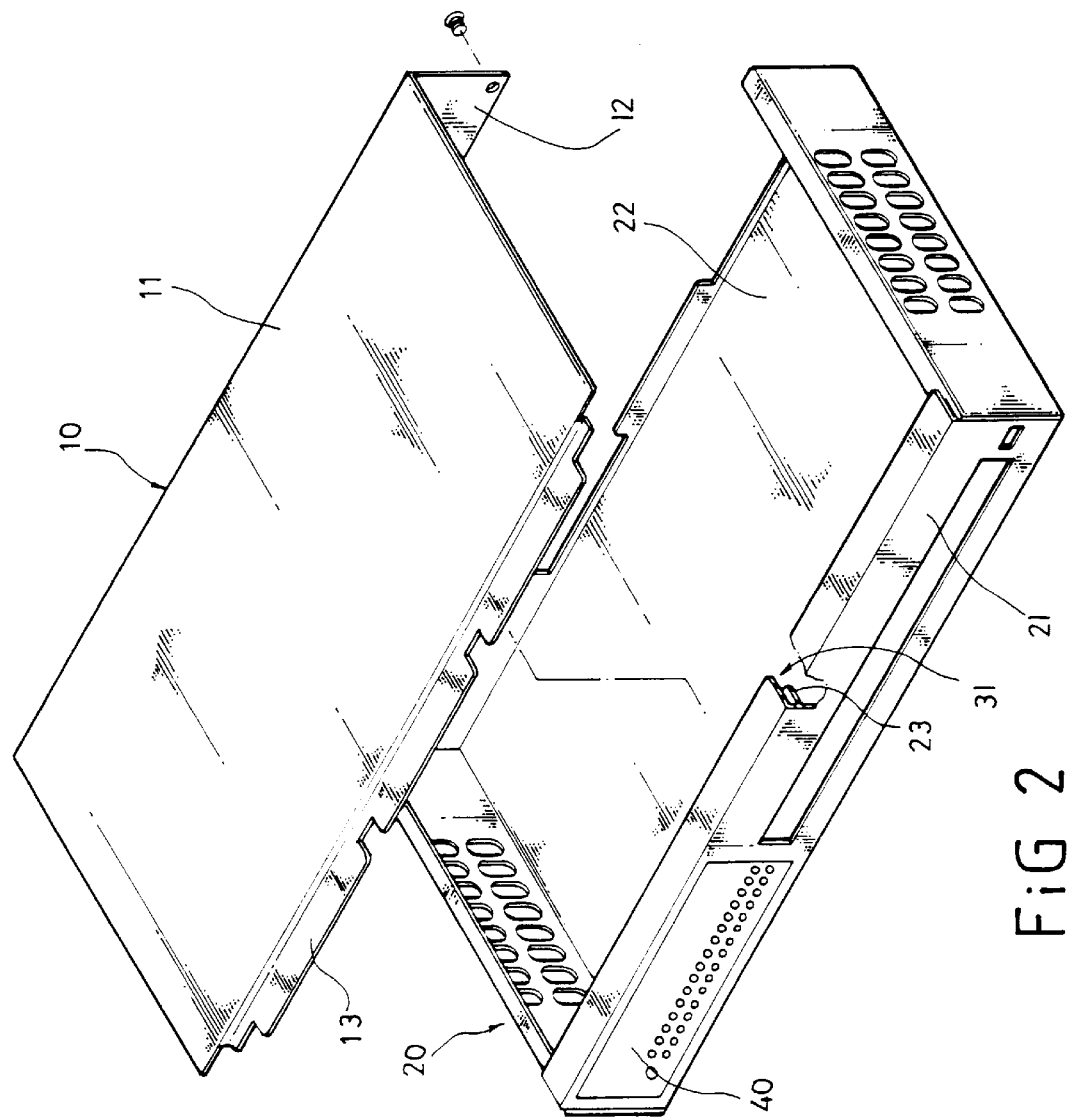
FIG. 2 is an exploded view of a network device case according to the present invention.

Referring to FIG. 2, a network device case in accordance with the present invention is comprised of a top cover shell 10, and a bottom cover shell 20. The top cover shell 10 and the bottom cover shell 20 form a hollow rectangular container having six sides for holding a network device.

The top cover shell 10 is made of a metal sheet by stamping, comprising a flat top panel 11, a vertical back panel 12 perpendicularly downwards extended from one side, namely, the rear side of the flat top panel 11, and a forward tongue 13 forwardly extended from one side, namely, the front side of the flat top panel 11.

The bottom cover shell 20 is made of metal sheet by stamping, comprising a flat bottom panel 22, a vertical front panel 21 perpendicularly raised from one side, namely, the front side of the flat bottom panel 22, and two vertical side panels (also referenced by 20) respectively perpendicularly raised from two opposite lateral sides of the flat bottom panel 22. A clamping plate 23 which has a U-shaped cross section is horizontally provided at the top of the back side of the vertical front panel 21, defining a horizontal receiving groove 31. When the top cover shell 10 is covered on the bottom cover shell 20, the forward tongue 13 of the top cover shell 10 is inserted into the horizontal receiving groove 31 at the front panel 21 of the bottom cover shell 20, and the vertical back panel 12 of the top cover shell 10 is fixedly fastened to the bottom cover shell 20 by screws. When assembled, the flat top panel 11 and vertical back panel 12 of the top cover shell 10 and the vertical front panel 21 and two lateral side panels of the bottom cover shell 20 define an enclosed space to hold a network device.

The vertical side panels of the bottom cover shell 20 each have a plurality of air vents for ventilation. The vertical front panel 21 of the bottom cover shell 20 has a plurality of indicator light holes and switch mounting holes for receiving indicator lights and switches. Furthermore, a replaceable metal plate 40 is mounted in a hole at the vertical front panel 21 of the bottom cover shell 20. The replaceable metal plate 40 as a number of indicator light holes for receiving indicator lights of the network device to be protected. When a different type of network device is installed, a particular replaceable metal plate 40 is used and mounted on the vertical front panel 21 of the bottom cover shell 20 to match the design of the indicator lights of the network device. Therefore, the network device case can be used with any of a variety of network devices simply by changing the replaceable metal plate 40.

While only one embodiment of the present invention has been shown and described, it will be understood that various modifications and changes could be made thereunto without departing from the spirit and scope of the invention disclosed.

What the invention claimed is:

1. A network device case comprising a bottom cover shell and a top cover shell covered on said bottom cover shell and forming with said bottom cover shell a rectangular container having a horizontal top panel, a horizontal bottom panel, a vertical front panel, a vertical rear panel, and two vertical lateral side panels, wherein said top cover shell comprises at least said horizontal top panel; said bottom cover shell comprises at least said vertical front panel and said horizontal bottom panel; said vertical rear panel is fixed to said horizontal bottom panel by screws and nuts and, said horizontal top panel and said vertical front panel are fastened together by a tongue-and-groove joint, said tongue-and-groove joint comprising a horizontal tongue integral with one of said horizontal top panel and said vertical front panel, and a horizontal groove defined in a clamping plate fixedly connected to the other of said horizontal top panel and said vertical front panel.

2. The network device case of claim 1 wherein said clamping plate is welded to a back side wall of said vertical front panel, and said tongue is integral with a front side of said horizontal top panel remote from said vertical rear panel.

3. The network device case of claim 1 wherein said clamping plate is welded to a front side of said horizontal top panel remote from said vertical rear panel, and said tongue is integral with a back side wall of said vertical front panel.

* * * * *